US005950328A

United States Patent [19]

Ichiko et al.

[11] Patent Number: 5,950,328
[45] Date of Patent: Sep. 14, 1999

[54] DRYING METHOD AND DRYING EQUIPMENT

[75] Inventors: Ikuhiro Ichiko, Oimachi; Kazutoshi Watanabe, Tsuchiura, both of Japan

[73] Assignee: Kimmon Quartz Co., Ltd., Tokyo, Japan

[21] Appl. No.: 08/994,669

[22] Filed: Dec. 19, 1997

[30] Foreign Application Priority Data

Jul. 22, 1997 [JP] Japan .................................... 9-195970

[51] Int. Cl.[6] ................................................. F26B 21/00
[52] U.S. Cl. ................................ 34/364; 34/370; 34/381; 34/402; 34/74; 34/78
[58] Field of Search ............................. 34/337, 343, 348, 34/351, 360, 364, 370, 381, 402, 73, 74, 75, 76, 77, 78, 202, 210; 134/21, 105, 108, 902

[56] References Cited

U.S. PATENT DOCUMENTS 5,369,891 12/1994 Kamikawa ............................... 34/77 X
5,657,553 8/1997 Tarui et al. ................................. 34/78

Primary Examiner—Henry Bennett
Assistant Examiner—Steve Gravini
Attorney, Agent, or Firm—Frishauf, Holtz, Goodman Langer & Chick, P.C.

[57] ABSTRACT

A drying equipment includes an equipment body including a vapor bath, carrier for carring a semiconductor wafer, receiver tray, inert gas supply unit, cooling pipe, exhaust unit, transportation unit, control unit, etc. An air supply opening of a blower is opposite to a top opening of the vapor bath. The vapor bath contains an organic solvent therein. A vapor is generated by heating the organic solvent. A vapor phase boundary surface is formed on the boundary between the vapor and air overlying the same. When the wafer at low temperature is put into the vapor bath by means of the transportation unit, the organic solvent vapor condenses on the surface of the wafer. The inert gas supply unit supplies an inert gas to the vapor in the vapor bath. The wafer is pulled up slowly from the vapor by means of the transportation unit, and passes the vapor phase boundary surface on the way.

7 Claims, 12 Drawing Sheets

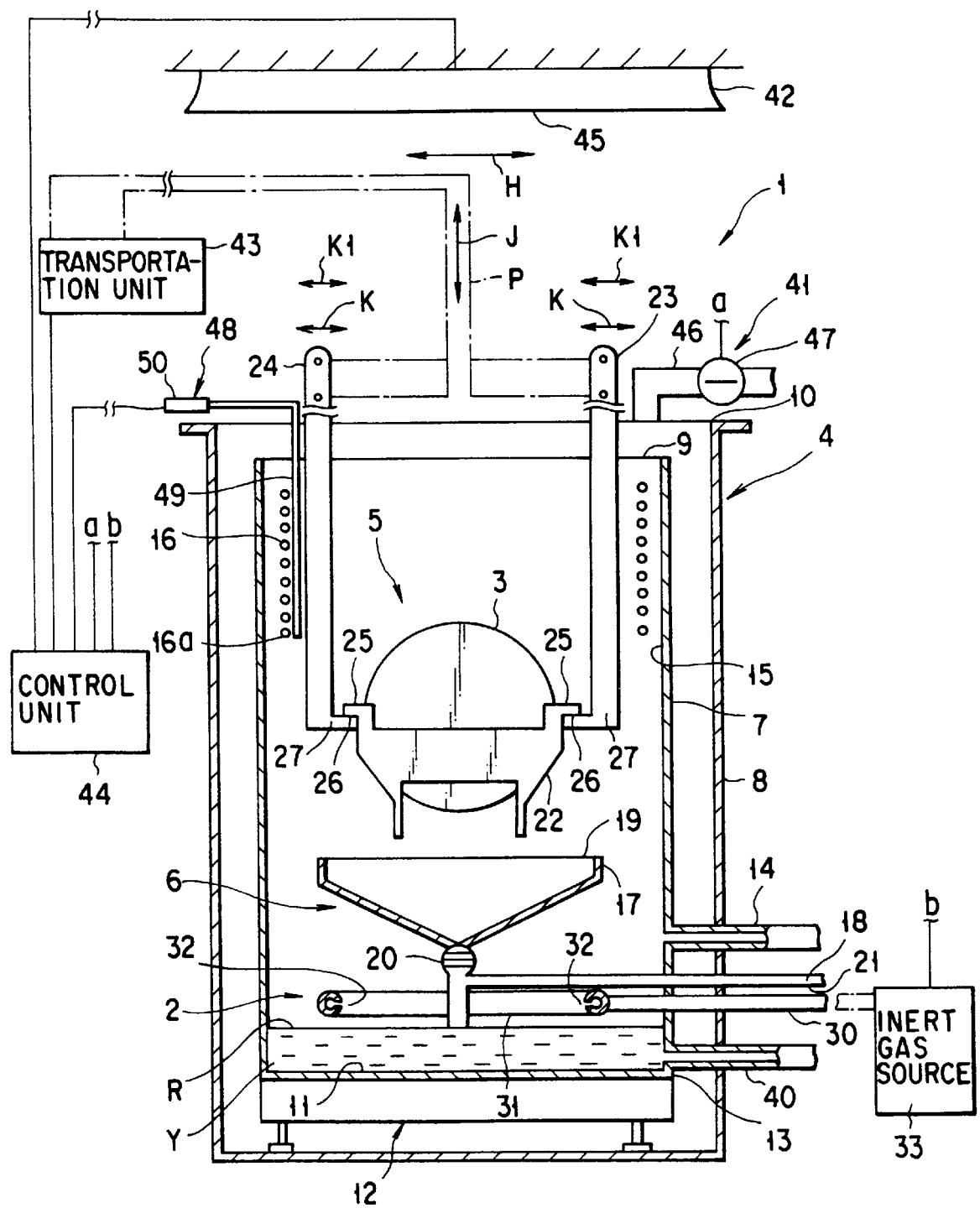
F I G. 1

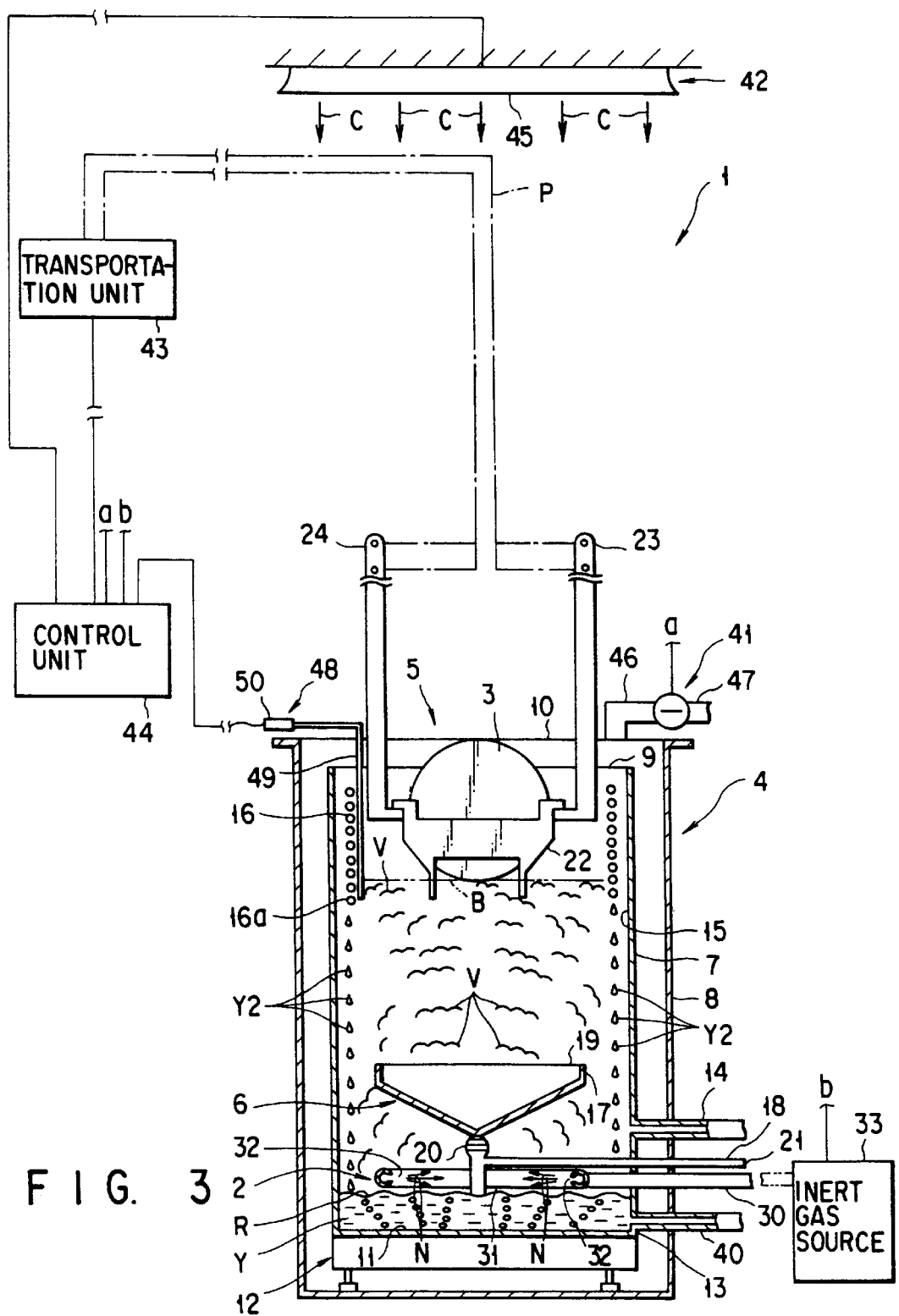
F I G. 3

DRYING METHOD AND DRYING EQUIPMENT

BACKGROUND OF THE INVENTION

The present invention relates to a drying method and a drying equipment for drying objects to be dried, such as cleaned wafers of semiconductors, substrates for liquid crystal displays, substrates for recording disks, etc.

A vapor dryer 70 shown in FIG. 10, for example, is known equipment for drying to-be-dried objects, such as rinsed semiconductor wafers (hereinafter referred to simply as wafers). The vapor dryer 70 comprises a body 71, carrier 72 for carrying a wafer 3, receiver tray 73, etc. The body 71 has a dual structure including a vapor bath 74 as a treatment bath containing an organic solvent Y and an outer chamber 75 surrounding the bath 74. Isopropyl alcohol (hereinafter referred to as IPA) is an example of the organic solvent Y. A heat block 77 is provided between a bottom portion 76 of the vapor bath 74 and the outer chamber 75. As the organic solvent Y is heated by the heat block 77, it evaporates and forms a vapor V.

The wafer 3 to be dried is washed with a cleaning fluid, such as water, in a cleaning process before it is put into the vapor bath 74. Immediately after it is put into the bath 74, therefore, the wafer 3 has the vapor on its surface, and its temperature is relatively low. The wafer 3 having the fluid thereon is exposed to the vapor V while held by means of a carrier (not shown) and is put into the vapor bath 74. In the bath 74, the organic solvent vapor V condenses on the surface of the wafer 3, whereby the organic solvent replaces the vapor or water on the wafer surface. The vapor or water flows down from the wafer surface and is recovered by the receiver tray 73. As the organic solvent on the surface of the wafer 3 evaporates, the wafer 3 is dried in a short period of time. As the cleaning fluid (water) flows down from the wafer surface, foreign matter or particles on the wafer surface are washed away by the fluid. If the cleaning fluid only flows down, however, the particles cannot be thoroughly removed from the wafer surface, in some cases.

The wafer 3 is washed with the cleaning fluid such as water is at a relatively low temperature immediately after it is put into the vapor bath 74. Accordingly, the vapor V condenses on both the mirror and non-mirror surfaces of the wafer 3 at the same time. This condensation continues until the temperature of the wafer 3 becomes equal to that of the vapor V. Hereinafter, this condensation will be referred to as "primary condensation."

The temperature of the wafer 3 in the vapor bath 74 gradually increases, and finally reaches a heat balance point, which is substantially equal to the temperature of the vapor V. When this condition is established, latent heat of the vapor V condensed on one side (e.g., mirror surface) of the wafer 3 is absorbed by the wafer 3. Since the wafer 3 is kept thermally balanced in the vapor V, heat in the same quantity as the latent heat is transmitted to the reverse surface of the wafer 3. On the reverse surface of the wafer 3, therefore, the heat of vaporization is applied to the vapor V going to condense or having condensed. Thus, on the reverse side of the wafer 3, the vapor V fails to condense, so that a dry condition is maintained. This condensation will hereinafter be referred to as "thermally-balanced condensation."

In the vapor bath 74, the vapor V exists on both the mirror and non-mirror surfaces of the wafer 3. In the case of the aforesaid "thermally-balanced condensation," therefore, if the vapor V condenses on either of the mirror and non-mirror surfaces, the other surface is inevitably dried up.

Thus, the mirror and non-mirror surfaces of the wafer 3 are brought to a very unstable condition such that they are liable to cause the vapor V to condense or be dried up. Accordingly, the mirror and non-mirror surfaces of the wafer 3 alternately repeat vapor condensation and drying, so that the following problems are aroused.

The organic solvent Y in the vapor bath 74 heated by the heat block 77 produces the vapor V. If the vapor V condenses on the wafer surface as the wafer 3 is put into the vapor bath 74, however, the volume of the vapor V is reduced drastically. Since the heat block 77 continues to heat the organic solvent Y, the solvent continues to produce the vapor V. However, it sometimes takes, for example, tens of seconds for the whole wafer 3 to be covered again with the vapor V. In this case, the temperature of the wafer 3 reaches the temperature level of the vapor V so that the aforesaid condition of "thermally-balanced condensation" is established before the whole wafer 3 is covered with the vapor V. As a result, dry portions develop on either the mirror or non-mirror surface of the wafer 3, and particles on those portions may remain without being removed, in some cases. Before the wafer 3 is entirely covered again with the vapor V, moreover, it is exposed to air, and therefore, is subjected to air-drying. Inevitably, therefore, natural oxide films or spots, called watermarks, are formed along the respective contours of drops of the vapor having so far been on the wafer 3.

BRIEF SUMMARY OF THE INVENTION

Accordingly, the object of the present invention is to provide a drying method and a drying equipment, capable of securely removing particles from both mirror and non-mirror surfaces of an object to be dried, such as a wafer, without leaving any watermarks on the to-be-dried object.

In order to achieve the above object, a drying method according to the present invention comprises: a vapor generating process for generating a vapor of an organic solvent in a vapor bath and forming a vapor phase boundary surface on the boundary between the vapor and air overlying the same; a condensing process for putting a to-be-dried object at a temperature lower than that of the vapor into the vapor bath and situating the object below the vapor phase boundary surface, thereby condensing the organic solvent vapor on the surface of the object; and a lifting process for lifting the to-be-dried object in the vapor bath so that the object passes the vapor phase boundary surface on the way, whereby the organic solvent on the surface of the object is swept off on the vapor phase boundary surface.

After the to-be-dried object washed with water or the like and kept at low temperature is put into the vapor bath in the condensing process, the organic solvent vapor condenses on the surface of the object the moment the object is covered with the vapor. The organic solvent on the object surface is swept off by means of the surface tension of the vapor phase boundary surface as the object passes the boundary surface in the aforesaid lifting process.

Preferably, the condensing process includes a process for injecting an inert gas into the vapor in the vapor bath as the vapor condenses on the surface of the to-be-dried object. According to this process, the vapor is increased in volume by being diluted with the inert gas as it condenses. Even though the organic solvent vapor continues to condense on the surface of the to-be-dried object, therefore, the height level of the vapor phase boundary surface can be maintained, so that the object can be entirely covered with the vapor.

A drying equipment according to the invention comprises: a vapor bath having an opening portion large enough to allow the passage of a to-be-dried object at the top and containing an organic solvent therein; a heat block for heating the organic solvent in the vapor bath, thereby generating a vapor; boundary surface forming means for forming a vapor phase boundary surface on the boundary between the organic solvent vapor in the vapor bath and air overlying the same; a carrier member for holding the to-be-dried object; and a transportation unit for causing the object held by means of the carrier member to pass the vapor phase boundary surface by placing the object under the boundary surface and then raising the object. Preferably, the boundary surface forming means includes exhaust means for discharging gases from the vapor bath through the top portion thereof, clean air supply means for supplying clean air toward the opening portion of the vapor bath, and cooling means located in the vicinity of the opening portion of the vapor bath and used to condense the vapor.

In the drying equipment of the invention constructed in this manner, the vapor phase boundary surface is formed on the boundary between the organic solvent vapor and air overlying the same in the vapor bath.

Further preferably, the drying equipment of the invention comprises an inert gas supply unit as means for condensing the organic solvent vapor on both the mirror and non-mirror surfaces of the to-be-dried object in a short period of time. This inert gas supply unit is provided with gas injection nozzles through which the inert gas, such as nitrogen gas, is injected into the vapor bath when the to-be-dried object is put into the vapor bath. The vapor in the vapor bath is increased in volume as it is diluted with the inert gas.

When the to-be-dried object washed with water or the like and kept at low temperature is covered with the organic solvent vapor after it is put into the vapor bath, the organic solvent vapor condenses on the surface of the object. As the vapor condenses in this manner, the inert gas is fed into the vapor bath through the supply unit. Thereupon, the vapor is increased in volume as it is diluted. Even though the organic solvent vapor condenses on the surface of the to-be-dried object, therefore, the height level of the vapor phase boundary surface can be maintained, so that the object can be entirely covered with the vapor. Accordingly, the organic solvent condenses on the to-be-dried object throughout its surface. As the object is pulled up from the vapor bath, the organic solvent thereon is swept off by means of the surface tension of an organic solvent layer that is formed on the vapor phase boundary surface. Since the to-be-dried object is not subjected to natural drying in the air, according to the present invention, watermarks can be prevented from being formed on the surface of the object.

The drying equipment of the invention comprises the clean air supply means for feeding clean air into the vapor bath and the exhaust means for sucking the gases in the vapor bath. In order to form a stable vapor phase boundary surface without turbulence, the supply of the clean air from the clean air supply means and the displacement of the exhaust gases sucking by the exhaust means are controlled and balanced. Thus, as the to-be-dried object is pulled up into the air through the vapor phase boundary surface, the exhaust means is stopped from discharging the gases from the vapor bath, and the clean air supply from the clean air supply means is reduced. Since the vapor phase boundary surface is stabilized by doing this, the organic solvent and particles on the surface of the to-be-dried object can be securely swept off by the works of the surface tension of the boundary surface.

The "inert gas" stated herein means a chemically inactive gas, such as nitrogen, helium, or some other inert-gas element, which reacts to no organic solvent. On the other hand, the "clean air" implies a gas that contains minimum quantities of foreign matters, such as dust, particles, etc., and is not always atmospheric air. For example, an inert gas such as nitrogen may be used as the clean air.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a vertical sectional view of a drying equipment according to an embodiment of the present invention;

FIG. 3 is a vertical sectional view showing a condition in which the wafer is in contact with a vapor phase boundary surface in the drying equipment of FIG. 1;

DETAILED DESCRIPTION OF THE INVENTION

Figure 2:
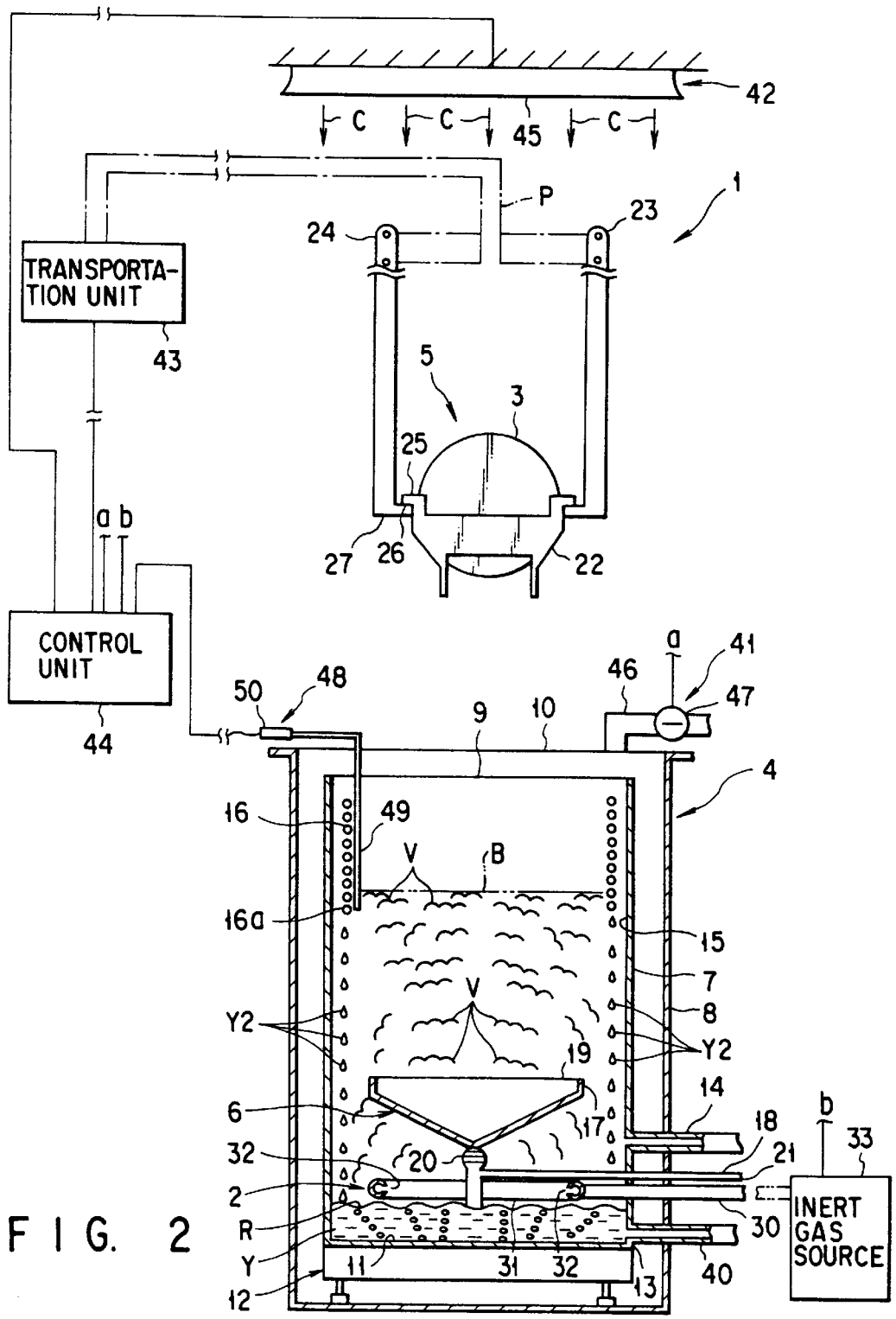
FIG. 2 is a vertical sectional view showing a condition established before a wafer is put into a vapor bath in the drying equipment of FIG. 1.

Referring now to FIGS. 1 to 9, an embodiment of the present invention will be described in detail.

A drying equipment 1 shown in FIG. 1 comprises an equipment body 4, carrier 5, receiver tray 6, inert gas supply unit 2, cooling pipe 16 for use as cooling means, exhaust unit 41 for use as exhaust means, transportation unit 43 for use as transformation means, control unit 44 for use as control means, etc.

The carrier 5 supports a cleaned wafer 3 as an example of a to-be-dried object. The receiver tray 6 has a function to recover a cleaning fluid (e.g., water) that flows down from the surface of the wafer 3. The inert gas supply unit 2 feeds an inert gas (e.g., nitrogen gas) into the equipment body 4. The exhaust unit 41 has a function to discharge gases (vapor and air in the main) in a vapor bath 7 to the outside of the body 4.

The equipment body 4 has a dual structure including the vapor bath 7 as a treatment bath and an outer chamber 8. The vapor bath 7 serves as a drying bath, which contains an organic solvent Y, such as IPA (isopropyl alcohol), therein. The outer chamber 8 surrounds the bath 7, and thermally isolates the interior of the bath 7 from the outside of the equipment body 4. Formed in the respective top portions of the baths 7 and 8 are top openings 9 and 10, respectively, through which the carrier 5 and the wafer 3 can pass. The top opening 9 of the vapor bath 7 corresponds to an opening portion described herein.

The vapor bath 7 is formed of a material (e.g., quartz or the like) that cannot be easily corroded by the organic solvent Y. The outer chamber 8 is formed of a material having relatively low thermal conductivity, such as a stainless steel plate, whereby heat generated in the vapor bath 7 is prevented from being easily transmitted to the outside of the equipment body 4. Both the vapor bath 7 and the outer chamber 8 are in the form of a box each.

A heat block 12 is provided between a bottom portion 11 of the vapor bath 7 and the outer chamber 8. The heat block 12 has a function to heat the organic solvent Y in the vapor bath 7. A conventional plate heater is an example of the heat block 12.

A solvent supply pipe 14 is connected to the vapor bath 7. The pipe 14 penetrates the outer chamber 8, and is led out of the equipment body 4. The pipe 14 has a function to feed the organic solvent Y into the vapor bath 7. A discharge pipe 40 is connected to a lower portion 13 of the bath 7. The pipe 40 penetrates the outer chamber 8, and is led out of the equipment body 4. The pipe 40 has a function to discharge the organic solvent Y from the vapor bath 7.

A cooling pipe 16 is provided beside the top opening 9 of the vapor bath 7. Cooling water as a cooling medium circulates in the pipe 16. The pipe 16 is a coil-like structure that extends along an inside wall 15 of the bath 7. As shown in FIG. 2, the vapor V that exists in the vicinity of the opening 9 of the bath 7 is cooled and liquefied by the pipe 16. Thus, the cooling pipe 16 has a function to prevent the vapor V in the vapor bath 7 from getting out through the top opening 9.

The receiver tray 6 is provided with a receiver 17 in the vapor bath 7 and a drain pipe 18 that opens into the bottom portion of the receiver 17. The receiver 17 is situated in a position higher than a level R of the organic solvent Y. The receiver 17 has an opening portion 19 at the top. The opening portion 19 is large enough to receive fluids (water and IPA in the main) flowing down from the wafer 3 that is supported by the carrier 5. One end 20 of the drain pipe 18 is connected to the bottom of the receiver 17. The other end 21 of the pipe 18 penetrates the vapor bath 7 and the outer chamber 8, and is led out of the equipment body 4. The fluids dropped into the receiver 17 are discharged from the body 4 through the pipe 18.

A blower 42 for use as clean air supply means is located over the top opening 9 of the vapor bath 7. An air supply opening 45 of the blower 42 faces the top openings 9 and 10 of the equipment body 4. The blower 42 is used to blow clean air, supplied from a clean air source (not shown), toward the openings 9 and 10. The blower 42 may be formed integrally with or independently of the drying equipment 1. Also, the blower 42 may be provided in a washing machine (not shown) for rinsing the wafer 3. In the case where the blower 42 and the drying equipment 1 are incorporated in the washing machine, the clean air is compressed by the blower 42 as it is supplied toward the top openings 9 and 10. By doing this, the respective internal pressures of the washing machine and the drying equipment 1 are made higher than the atmospheric pressure, so that foreign matters such as particles can be prevented from getting into these equipments.

The exhaust unit 41 includes an exhaust pipe 46 having one end opening into the top portion of the vapor bath 7 and an exhaust valve 47 connected to the other end side of the pipe 46. The pipe 46 is connected to a suction system (not shown), e.g., a vacuum pump. When the exhaust valve 47 is opened, the exhaust unit 41 discharges the gases in the vapor bath 7 to the outside of the equipment body 4. The unit 41 sucks in the vapor V that has failed to be liquefied by the cooling pipe 16 and remains in the vicinity of the top openings 9 and 10. Thus, the vapor V can be securely prevented from getting out through the openings 9 and 10.

The blower 42 and the clean air source as the clean air supply means, in conjunction with the exhaust unit 41 and the cooling pipe 16, constitute boundary surface forming means for forming a vapor phase boundary surface, which will be mentioned later.

A detecting element 49 of a temperature sensor 48 is provided in the vicinity of the top opening 9, inside the vapor bath 7. The sensor 48 is composed of the detecting element 49 and a measuring portion 50. The element 49 extends downward from the opening 9, and its lower end is situated substantially at the same height as a bottom turn portion 16a of the cooling pipe 16. The temperature sensor 48 serves to detect the temperature of a region near the bottom turn portion 16a. The measuring portion 50 is connected electrically to the control unit 44, and delivers electrical signals related to the temperature detected by the detecting element 49 to the unit 44.

As shown in FIG. 1, the carrier 5 comprises a carrier member 22, which can hold a plurality of disk-shaped wafers 3 at a time, and a pair of suspenders 23 and 24 for suspending the member 22. The carrier member 22 holds the wafers 3 in a manner such that the wafers are arranged upright and parallel to one another at regular intervals. The member 22 includes a pair of hook portions 25 that extend continuously from the front side to the back side of FIG. 1.

The suspenders 23 ad 24 extend in the vertical direction. Attached individually to the respective lower ends of the suspenders 23 and 24 are a pair of flange portions 27 that face each other. When the suspenders 23 and 24 are moved in the directions of arrows K1 in FIG. 1 by means of the transportation unit 43, the flange portions 27 engage the hook portions 25 of the carrier member 22, individually. The member 22 is supported by the respective upper surfaces 26 of the flange portions 27. The suspenders 23 and 24 may be provided in a plurality of pairs arranged from the front side to the back side of FIG. 1, depending on the size of the carrier member 22 or the like.

The transportation unit 43 is connected to the respective upper ends of the suspenders 23 and 24, as indicated by dashed line in FIG. 1. The unit 43 can move the suspenders 23 and 24 in the directions of arrows K. Also, the unit 43 can move the suspenders 23 and 24 in the vertical direction (indicated by arrow J) and the horizontal direction (indicated by arrow H). Thus, the carrier member 22 can be moved to any desired position by means of the transportation unit 43. The member 22 can descend into and ascend from the vapor bath 7 through the top opening 9.

The transportation unit 43 causes the carrier member 22 to move in the aforesaid vertical and horizontal directions, thereby transferring the wafers 3 from the washing machine (not shown) to the drying equipment 1. After the wafers 3 are put into the vapor bath 7 by means of the transportation unit 43, they are pulled up into the air through a vapor phase boundary surface B (mentioned later), and are transported to the next stage of processing.

The inert gas supply unit 2 includes a gas supply pipe 30, circular pipe 31, gas injection nozzles 32 attached to the pipe 31, inert gas source 33, etc. One end of the supply pipe 30 is connected to the inert gas source 33. The other end of the pipe 30 is connected to the circuit pipe 31. The pipe 31 is in the form of a loop extending along the inside wall 15 of the vapor bath 7. The pipe 31 is situated between the level R of the organic solvent Y and the receiver 17.

The gas injection nozzles 32 are arranged at regular intervals in the circumferential (or longitudinal) direction of the circular pipe 31. These nozzles 32 are orifices that face inward or toward one another in the pipe 31. As shown in FIG. 3, an inert gas N supplied from the inert gas source 33 to the circular pipe 31 through the gas supply pipe 30 is injected into the vapor bath 7 through the gas injection nozzles 32.

The control unit 44, which is formed of a microcomputer or the like, includes a CPU (central processing unit) having computation and control functions, ROM (read-only memory), RAM (random access memory), etc. The control unit 44 is connected electrically to the transportation unit 43, blower 42, inert gas source 33, temperature sensor 48, exhaust unit 41, etc., and carries out general control of the drying equipment 1 by controlling the operations of these individual elements.

When the exhaust valve 47 is opened in response to a signal delivered from the control unit 44, for example, the gases in the vapor bath 7 are discharged. As this is done, the control unit 44 outputs a signal for rotating the blower 42, thereby causing a predetermined quantity of clean air to be supplied toward the top openings 9 and 10. When the exhaust valve 47 is closed in response to another signal delivered from the control unit 44, the vapor bath 7 ceases to be exhausted. At this time, the control unit 44 outputs a signal such that the rotational frequency of the blower 42 is made lower than when the exhaust valve 47 is open, thereby substantially halving the flow rate of the clean air. Further, the control unit 44 controls the blower 42 in a manner such that a quantity of clean air substantially proportional to the quantity of gases discharged by the exhaust unit 41 is fed into the vapor bath 7 during the time interval that elapses from the instant that the exhaust valve 47 is closed until the valve 47 is fully open. If this is done, the volume of flowing of the clean air flowing into the vapor bath 7 becomes substantially equal to the volume of flowing of the gases discharged from the bath 7, so that the vapor phase boundary surface B (shown in FIG. 2 and other drawings) can be prevented from undergoing a turbulence.

The following is a description of the operation of the drying equipment 1.

Each wafer 3 cleaned or washed with the cleaning fluid such as water in the cleaning process is transported to a region above the equipment body 4 in a manner such that it is supported by the carrier, as shown in FIG. 1. The organic solvent Y is fed into the vapor bath 7 through the solvent supply pipe 14.

As the organic solvent Y is heated by the heat block 12 in a vapor generating process, as shown in FIG. 2, the vapor V of the solvent Y is generated. The vapor V is brought to a vapor-liquid equilibrium in the vapor bath 7. Since air exists over the vapor V, the vapor phase boundary surface B is formed at the boundary between the vapor V and the air. As the blower 42 is actuated, moreover, clean air C is fed toward the top openings 9 and 10. When the exhaust valve 47 is opened, the gases (vapor V and clean air in the main) in the vapor bath 7 are discharged to the outside of the equipment body 4.

In the vicinity of the cooling pipe 16, the vapor V is cooled by the pipe 16, and therefore, condenses on the surface of the pipe 16 and the like. The condensed and liquefied vapor V, that is, the organic solvent Y, drops into the vapor bath 7, as indicated by symbol Y2 in FIGS. 2 to 9. Accordingly, the vapor V is restrained from getting out of the bath 7 through the top opening 9, and the vapor phase boundary surface B is formed in the vicinity of the bottom turn portion 16a of the cooling pipe 16.

The wafer 3 washed in the rinsing process carries water as the cleaning fluid thereon. In the condensing process, the wafer 3 is put into the vapor bath 7 through the top openings 9 and 10 by means of the transportation unit 43 in a manner such that it is supported by the carrier member 22, as shown in FIG. 1. The inert gas N from the inert gas source 33 is injected into the vapor bath 7 through the gas injection nozzles 32 by being supplied to the circular pipe 31 when the lower end portion of the wafer 3 is brought into contact with the vapor phase boundary surface B, as shown in FIG. 3.

Figure 4:
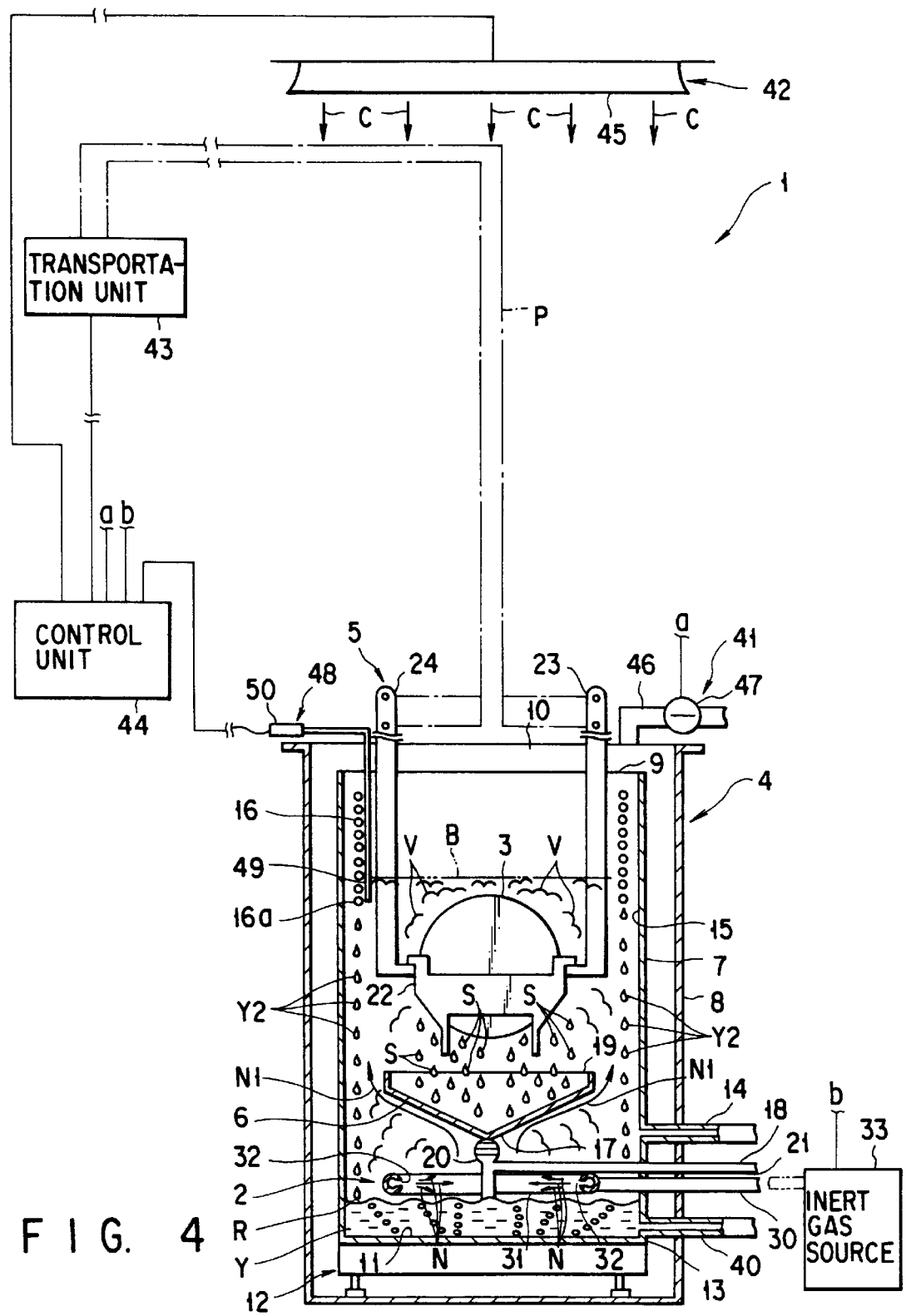
FIG. 4 is a vertical sectional view showing a condition in which the wafer is covered with a vapor in the drying equipment of FIG. 1.

The wafer 3 is further lowered by the transportation unit 43, and is situated below the vapor phase boundary surface B, as shown in FIG. 4. Since the wafer 3 is still at low temperature at this time, the vapor V is rapidly cooled over the whole surface of the wafer 3. Thereupon, the organic solvent vapor V condenses in a moment on the surface of the wafer 3, so that an organic solvent film is formed on the wafer surface. Thus, the volume of the vapor V is reduced.

Since the inert gas N is injected into the vapor bath 7 through the gas injection nozzles 32, however, the vapor V is increased in volume by being diluted with the gas N. Since several portions of the gas N are injected simultaneously from the nozzles 32 that face one another, moreover, they run against one another. As indicated by arrows N1 in FIG. 4, therefore, ascending currents of the vapor V are produced in the vapor bath 7, and the vapor V and the gas N are mixed together substantially uniformly. Accordingly, the vapor phase boundary surface B is kept substantially on the same level as before the wafer 3 is put into the bath 7. Thus, the wafer 3 is fully covered with the vapor V, and the condensation of vapor V on the whole surface of the wafer 3 is accomplished in a short period of time.

The inert gas N is fed continuously into the vapor bath 7 through the gas injection nozzles 32 until the condensation of the organic solvent vapor V on the whole surface of the wafer 3 is accomplished.

When the organic solvent film is formed on the surface of the wafer 3 as the organic solvent vapor V condenses on the wafer surface, the cleaning fluid (water) on the wafer surface is replaced by the organic solvent. The cleaning fluid S that has replaced the organic solvent flows down toward the receiver 17, as shown in FIG. 4. Along with the fluid S flowing down in this manner, the particles on the wafer surface also fall down into the vapor bath 7. Since the cleaning fluid S in the receiver 17 is discharged from the receiver 17 to the outside of the vapor bath 7 through the drain pipe 18, the purity of the organic solvent Y in the bath 7 can be kept substantially constant.

Figure 5:
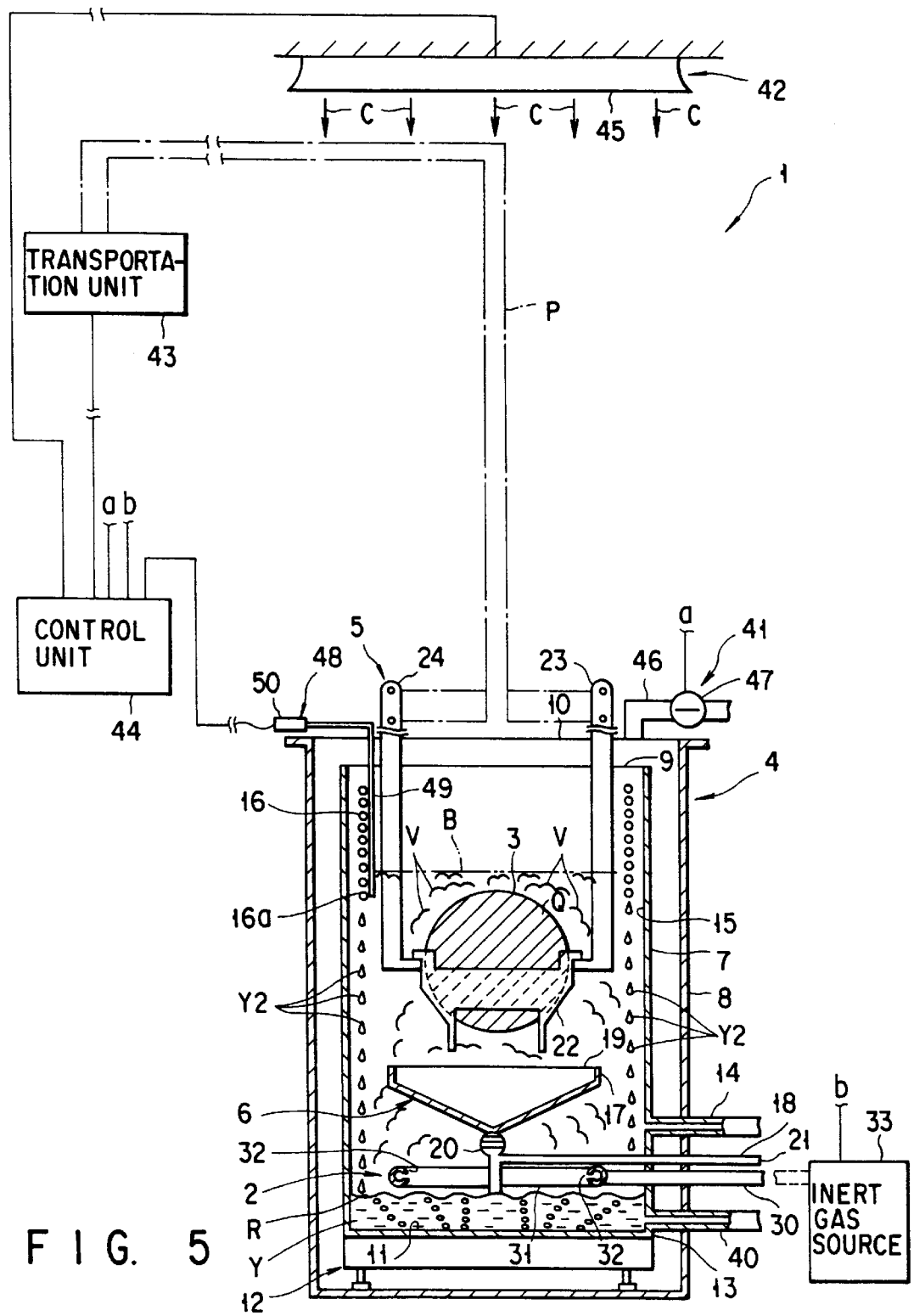
FIG. 5 is a vertical sectional view showing a condition in which an organic solvent is condensed on the surface of the wafer in the drying equipment of FIG. 1.

The condensation goes on after the organic solvent condenses on the whole surface of the wafer 3. Since the inert gas N continues to be fed into the vapor bath 7 through the gas injection nozzles 32, the vapor phase boundary surface B starts to rise. When the boundary surface B reaches the height level of the detecting element 49 of the temperature sensor 48, heat of the vapor V is detected by the element 49. Thereupon, the control unit 44 stops the inert gas supply unit 2 from supplying the inert gas N, as shown in FIG. 5. A hatching Q shown in FIGS. 5 to 7 indicates that region of the wafer surface which carries the organic solvent thereon.

When the vapor phase boundary surface B rises close to the top opening 9 of the vapor bath 7, the vapor V is cooled by the cooling pipe 16, so that it condenses on the surface of the pipe 16. As a result, the boundary surface B is restrained from rising above the level of the cooling pipe 16, so that the vapor V in the vapor bath 7 can be prevented from overflowing the equipment body 4 through the top openings 9 and 10.

The discharge of the gases from the vapor bath 7 is stopped by closing the exhaust valve 47 in a given period of time (e.g., 20 seconds or thereabout) after the supply of the inert gas N is stopped. At the same time, the supply of the clean air C from the blower 42 is reduced to about half the quantity used before the exhaust valve 47 is closed. By doing this, turbulence of the vapor phase boundary surface B in the vapor bath 7 can be restrained, so that the boundary surface B is stable.

Figure 6:
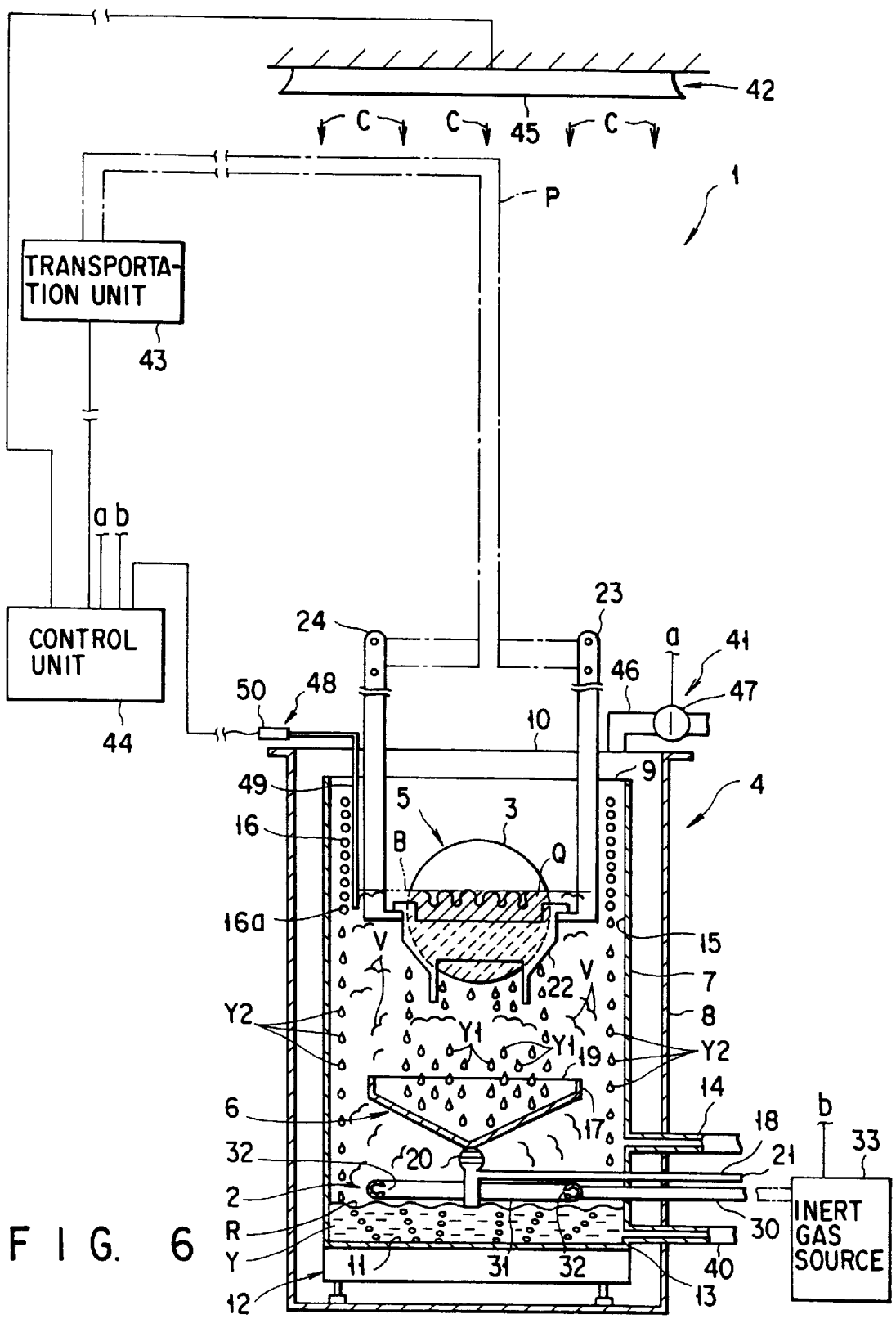
FIG. 6 is a vertical sectional view showing the way the wafer ascends in the drying equipment of FIG. 1.

By lifting the carrier 5 by means of the transportation unit 43 in a lifting process, thereafter, the wafer 3, along with the carrier member 22, is taken out slowly from the vapor bath 7. Thus, the wafer 3 ascends from the position shown in FIG. 5 to the position shown in FIG. 9 via the positions shown in FIGS. 6, 7 and 8. In the middle of this ascent, the wafer 3 passes the vapor phase boundary surface B, as shown in FIG. 6. The ascending speed of the wafer 3 passing the boundary surface B preferably ranges from 5 mm/sec to 10 mm/sec, and further preferably, is adjusted to 7 mm/sec or thereabout.

As the wafer 3 passes the vapor phase boundary surface B, the organic solvent having condensed on the surface of the wafer 3 is swept off into the receiver 17 by means of the surface tension of an IPA layer that is formed on the vapor phase boundary surface B. Thus, that portion of the wafer 3 which is situated above the boundary surface B is dried up in a short period of time. Further, the particles on the surface of the wafer 3, along with the organic solvent swept off from the wafer surface, fall down into the receiver 17, and are discharged from the vapor bath 7 through the drain pipe 18.

Figure 8:
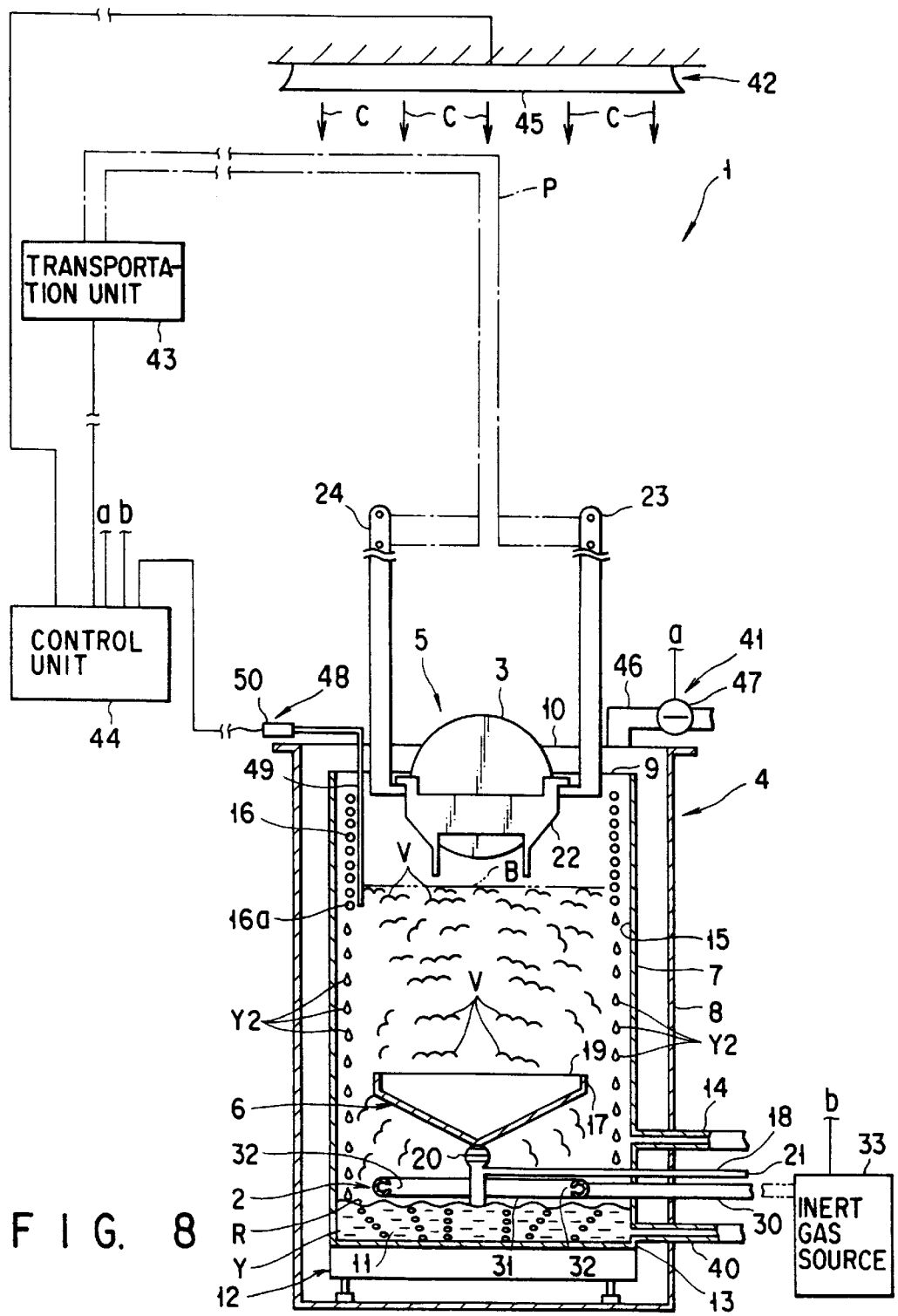
FIG. 8 is a vertical sectional view showing a condition in which the wafer is situated above the vapor phase boundary surface in the drying equipment of FIG. 1.
Figure 9:
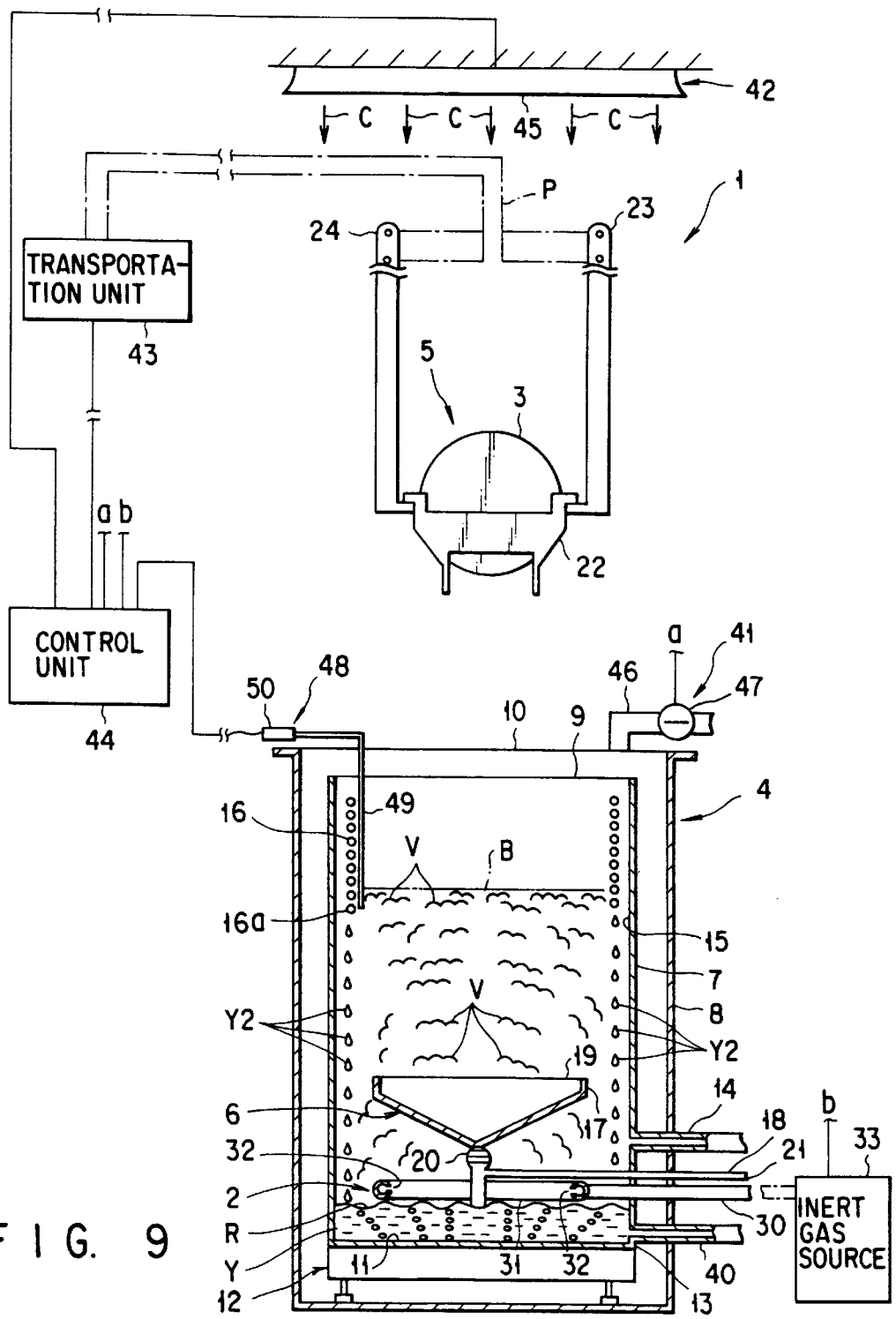
FIG. 9 is a vertical sectional view showing a condition established immediately before the wafer is transferred to the next stage of processing by means of a transportation unit in the drying equipment of FIG. 1.
Figure 10:
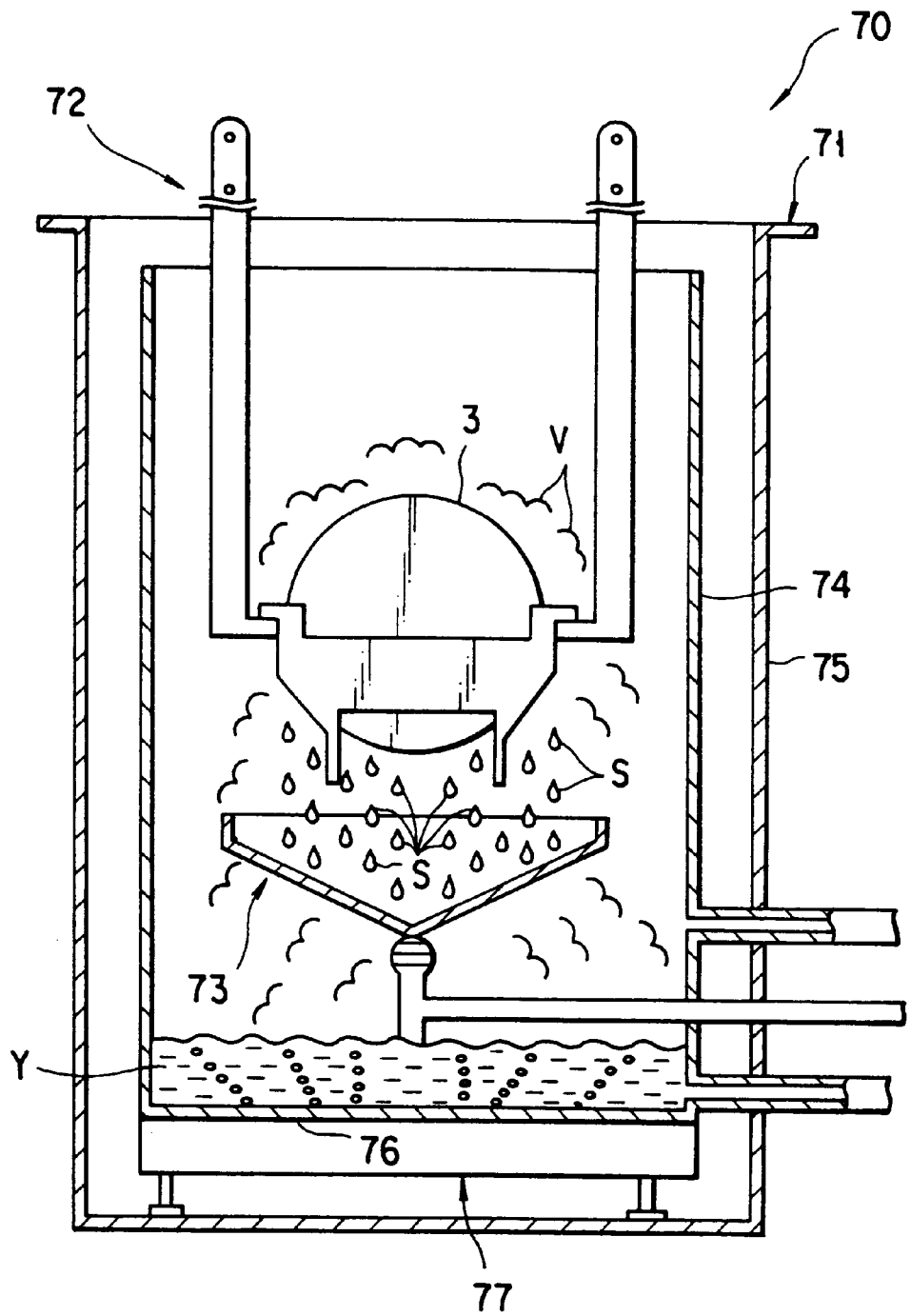
FIG. 10 is a vertical sectional view showing a conventional drying equipment.
Figure 11:
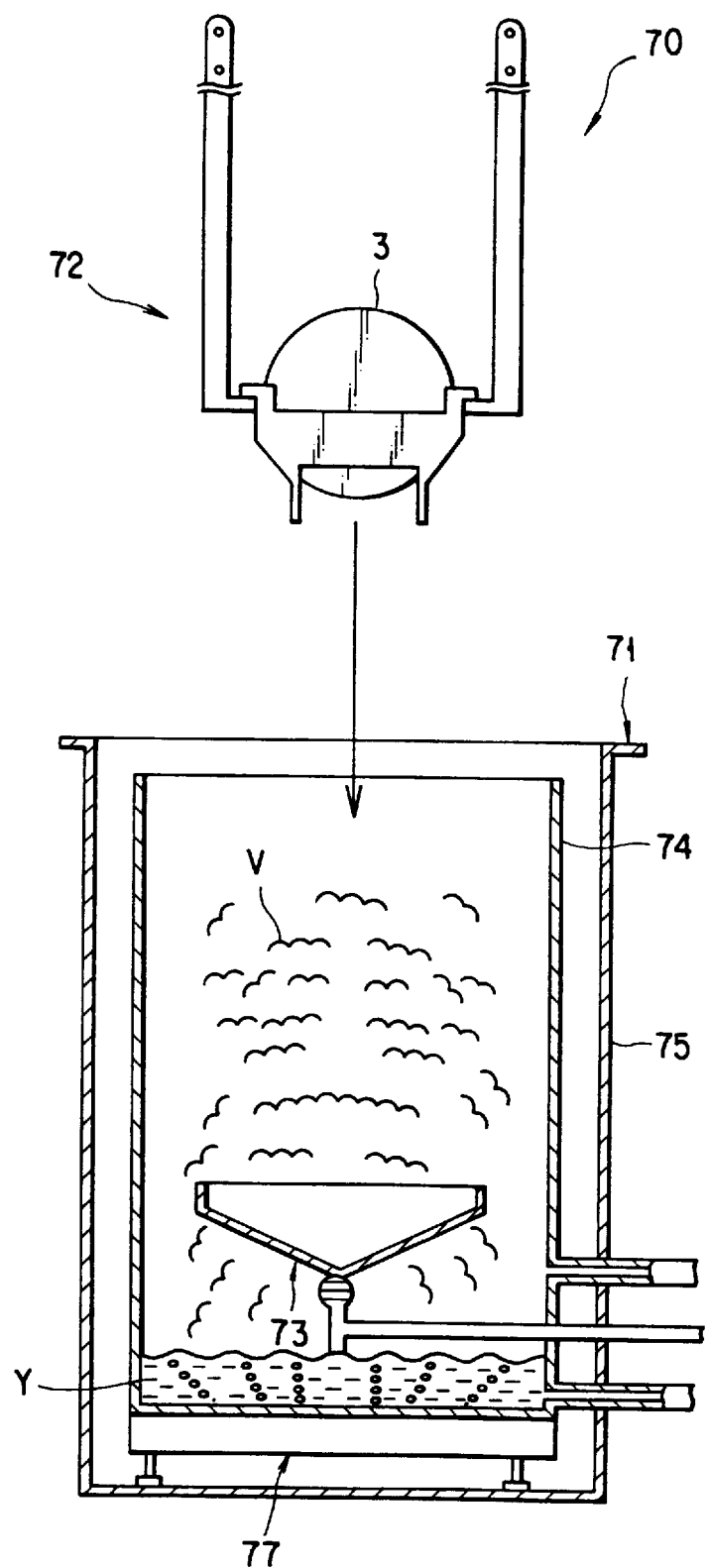
FIG. 11 is a vertical sectional view showing a condition established before a wafer is put into a vapor bath in the drying equipment of FIG. 10.
Figure 12:
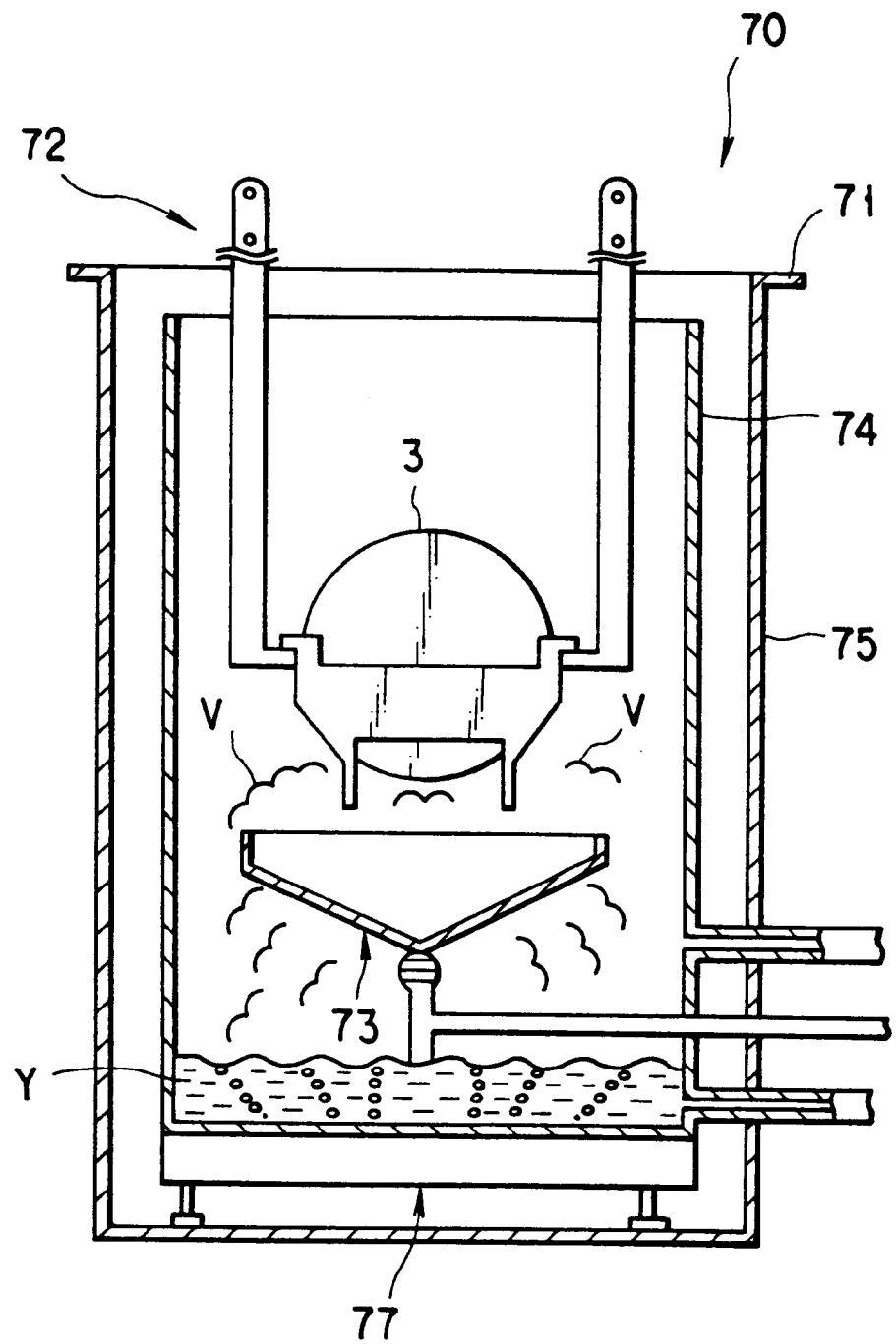
FIG. 12 is a vertical sectional view showing a condition in which the wafer is in the vapor bath in the drying equipment of FIG. 10.

The gases in the vapor bath 7 are discharged to the outside of the equipment body 4 by opening the exhaust valve 47 when the lower end of the wafer 3 is situated above the vapor phase boundary surface B, as shown in FIG. 8. At the same time, the supply of the clean air C from the blower 42 is restored to the value used before the wafer 3 is put into the vapor bath 7. When the wafer 3 is raised to the position shown in FIG. 9, it transferred together with the carrier member 22 to the next stage of processing by means of the transportation unit 43.

According to this embodiment, the volume of the vapor V can be increased by feeding the inert gas N into the vapor bath 7 by means of the inert gas supply unit 2 at the time of "primary condensation" such that the vapor V condenses on the rinsed wafer 3 at low temperature. Further, ascending currents of the vapor V can be produced by means of the inert gas N that is injected into the vapor bath 7 through the gas injection nozzles 32. Even though organic solvent components of the vapor V continue to condense on the surface of the wafer 3, therefore, the vapor phase boundary surface B can be prevented from lowering, so that the wafer 3 can be fully covered with the vapor V.

Accordingly, the cleaning fluid, such as water, on the wafer 3 can be securely replaced by the organic solvent in a short period of time with the progress of the aforesaid "primary condensation," so that the solvent can uniformly condense on the whole surface of the wafer 3. Since the wafer 3 is caused to pass the vapor phase boundary surface B in this state, the organic solvent Y1 on the wafer 3 can be securely swept off by means of the surface tension of the boundary surface B. Also, the particles on the wafer 3, along with the organic solvent Y1, can be removed from the wafer 3 for certain. Since the wafer 3 is surrounded by an inert gas ambient atmosphere in the vapor bath 7, moreover, natural oxide films or watermarks can be securely prevented from being formed on the surface of the wafer 3.

Figure 7:
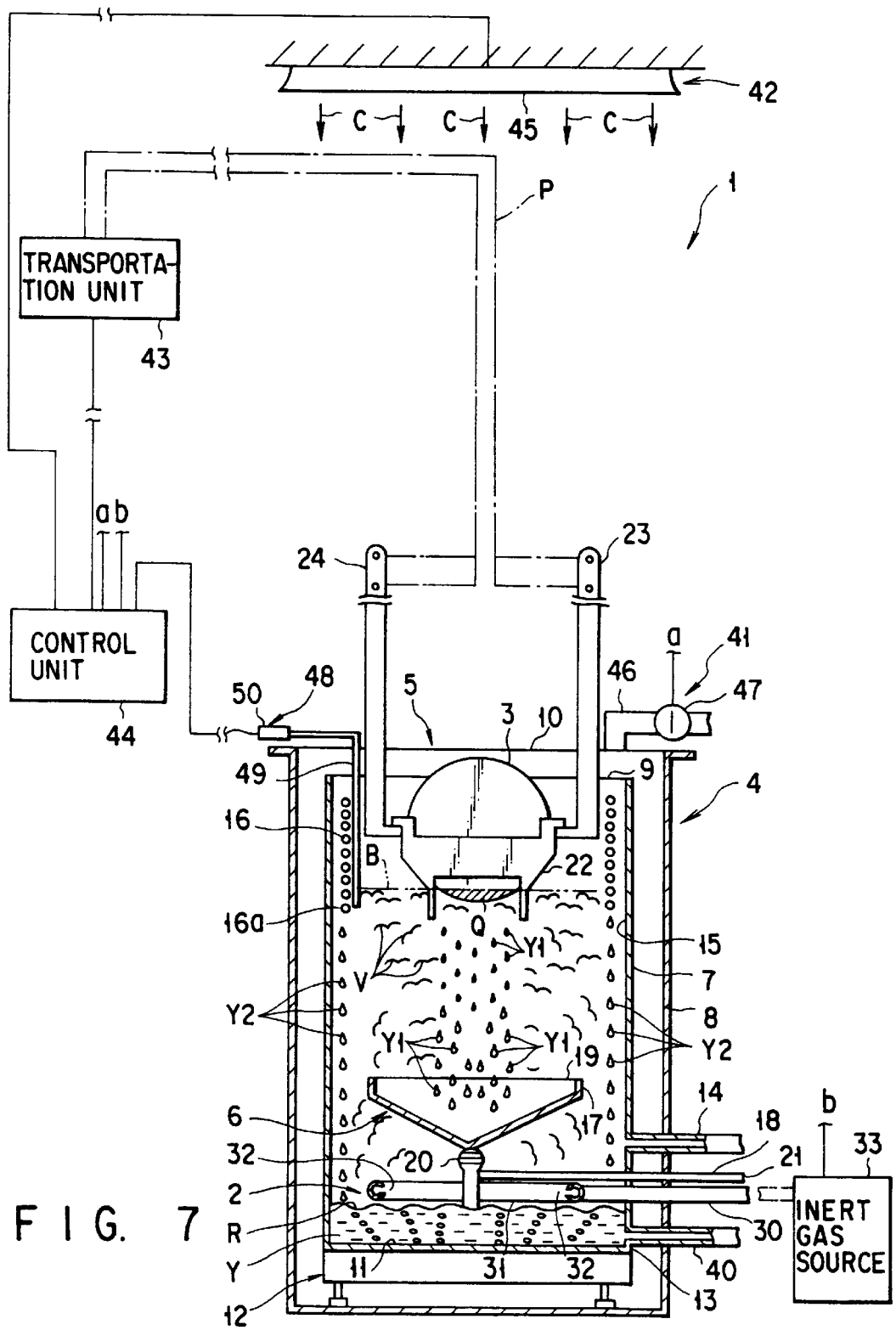
FIG. 7 is a vertical sectional view showing the way the organic solvent on the wafer is swept off by means of the vapor phase boundary surface in the drying equipment of FIG. 1.

In sweeping off the condensed organic solvent on the surface of the wafer 3 by means of the vapor phase boundary surface B, as shown in FIGS. 6 and 7, the exhaust valve 47 is closed, and the supply of the clean air from the blower 42 is reduced. Accordingly, the vapor phase boundary surface B is stabilized and can serve securely to remove the organic solvent and particles from the wafer surface.

The drying equipment and drying method according to the present invention are not limited to the embodiment described above. The invention may be also applied to any other means for drying other to-be-dried objects than semiconductor wafers, e.g., various substrates including glass substrates for liquid crystal displays, substrates for optical and magnetic recording disks, etc., for example.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. A method for drying a cleaned to-be-dried object, the method comprising the steps of:

a vapor generating step of generating an organic solvent vapor in a vapor bath and forming a vapor phase boundary surface at a boundary between the organic solvent vapor and air overlying the organic solvent vapor;

a condensing step of putting a to-be-dried object, which is at a temperature lower than that of the organic solvent vapor, into the vapor bath and situating the object below the vapor phase boundary surface to condense the organic solvent vapor on the surface of the to-be-dried object;

an injecting step of injecting an inert gas into the organic solvent vapor at a point below said vapor phase boundary surface when the organic solvent vapor condenses on the surface of the to-be-dried object; and a lifting step of raising the to-be-dried object in the vapor bath so that the to-be-dried object traverses the vapor phase boundary surface, wherein when the to-be-dried object traverses the vapor phase boundary surface, the organic solvent condensed on the surface of the to-be-dried object is removed from the to-be-dried object.

2. The drying method according to claim 1, wherein each of said condensing step and said lifting step includes discharging, to a point outside of the vapor bath with exhaust means, gases overlying the vapor phase boundary surface, and providing clean air into the vapor bath from above the vapor phase boundary surface.

3. Apparatus for drying a cleaned to-be-dried object, comprising:

a vapor bath having an upper portion including an opening of sufficient size to enable passage of a to-be-dried object, the vapor bath containing an organic solvent therein;

a heat block for heating the organic solvent in the vapor bath to generate an organic solvent vapor therein;

boundary surface forming means for generating a vapor phase boundary surface at a boundary between the organic solvent vapor and air overlying the organic solvent vapor;

an inert gas supply unit for injecting an inert gas into the organic solvent vapor at a point below said vapor phase boundary surface;

a carrier member for holding the to-be-dried object; and a transportation unit for causing the to-be-dried object held by said carrier member to cross the vapor phase boundary surface.

4. Apparatus for drying according to claim 3, wherein said boundary surface forming means comprises exhaust means for discharging gases from the vapor bath through the top portion thereof, clean air supply means for supplying clean air toward the opening portion of the vapor bath, and cooling means proximate the opening portion of the vapor bath to condense the vapor.

5. Apparatus for drying according to claim 4, which further comprises control means for controlling the exhaust means and the clean air supply means, the control means controlling the clean air supply means such that the clean air corresponds in quantity to the gases discharged from the vapor bath by the exhaust means.

6. Apparatus for drying according to claim 5, wherein said control means controls the clean air supply means such that the discharge of gas by the exhaust means is suspended while the to-be-dried object passes the vapor phase boundary surface, and such that the quantity of clean air supplied to the vapor bath is reduced.

7. A method for drying a cleaned to-be-dried object, the method comprising the steps of:

a vapor generating step of generating an organic solvent vapor in a vapor bath and forming a vapor phase boundary surface at a boundary between the organic solvent vapor and air overlying the organic solvent vapor;

a condensing step of putting a to-be-dried object, which is at a temperature lower than that of the organic solvent vapor, into the vapor bath and situating the object below the vapor phase boundary surface to condense the organic solvent vapor on the surface of the to-be-dried object;

an injecting step of injecting an inert gas into the organic solvent vapor at a point below said vapor phase boundary surface when the organic solvent vapor condenses on the surface of the to-be-dried object; and a lifting step of raising the to-be-dried object in the vapor bath so that the to-be-dried object traverses the vapor phase boundary surface, wherein when the to-be-dried object traverses the vapor phase boundary surface, the organic solvent condensed on the surface of the to-be-dried object is removed by the vapor phase boundary surface;

wherein said condensing step includes discharging, outside of the vapor bath with exhaust means, gases overlying the vapor phase boundary surface, and providing clean air into the vapor bath from above the vapor phase boundary surface, and wherein said clean air corresponds in quantity to the gases discharged from the vapor bath.

* * * * *